US012610615B2

(12) United States Patent
Ethirajan et al.

(10) Patent No.: US 12,610,615 B2
(45) Date of Patent: Apr. 21, 2026

(54) DEVICE WITH ISOLATION STRUCTURES IN ACTIVE REGIONS

(71) Applicant: GlobalFoundries U.S. Inc., Malta, NY (US)

(72) Inventors: Tamilmani Ethirajan, Guilderland, NY (US); Kaustubh Shanbhag, Slingerlands, NY (US); George R. Mulfinger, Gansevoort, NY (US); Anton V. Tokranov, Halfmoon, NY (US); Eric S. Kozarsky, Ballston Spa, NY (US); Hui Zhan, Clifton Park, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 529 days.

(21) Appl. No.: 18/095,746

(22) Filed: Jan. 11, 2023

(65) Prior Publication Data

US 2024/0234425 A1 Jul. 11, 2024

(51) Int. Cl.
H10D 86/00 (2025.01)
H01L 23/535 (2006.01)
H10D 30/63 (2025.01)
H10D 86/01 (2025.01)
(52) U.S. Cl.
CPC ......... H10D 86/201 (2025.01); H01L 23/535 (2013.01); H10D 30/637 (2025.01); H10D 86/01 (2025.01)
(58) Field of Classification Search
CPC .... H10D 86/201; H10D 30/637; H10D 86/01; H01L 23/535
See application file for complete search history.

(56) References Cited

U.S. PATENT DOCUMENTS 7,074,623 B2 * 7/2006 Lochtefeld ......... H10D 30/6758
438/176
7,078,775 B2 * 7/2006 Yi ........................ H10D 64/519
257/E29.12
7,838,948 B2 * 11/2010 Gossner .............. H10D 64/257
257/401

(Continued)

FOREIGN PATENT DOCUMENTS

CN 205282459 U * 6/2016 ....... H01L 21/76805
CN 110416104 B * 3/2021 ............. H01L 22/14

(Continued)

OTHER PUBLICATIONS

Foreign Office Action dated Aug. 20, 2024 in TW Application No. 112148153, 12 pages.

(Continued)

*Primary Examiner* — Laura M Menz

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to devices with isolation structures in active regions and methods of manufacture. The structure includes: an active region; a plurality of isolation structures within the active region; a plurality of gate structures overlapping the plurality of isolation structures within the active region; and diffusion regions on sides of the plurality of gate structures and the plurality of isolation structures.

20 Claims, 7 Drawing Sheets

(56) References Cited

U.S. PATENT DOCUMENTS

| | | | | |
|---|---|---|---|---|
| 8,404,560 | B2 * | 3/2013 | Anderson | H01L 21/76283 |
| | | | | 438/430 |
| 8,952,424 | B2 | 2/2015 | Herberholz | |
| 9,245,903 | B2 * | 1/2016 | Cheng | H10D 87/00 |
| 9,559,119 | B2 * | 1/2017 | Cheng | H10D 64/259 |
| 9,590,064 | B2 * | 3/2017 | Petitprez | H01L 21/76802 |
| 9,917,103 | B1 * | 3/2018 | Mulfinger | H10D 30/0275 |
| 10,164,006 | B1 | 12/2018 | Ciavatti et al. | |
| 10,529,860 | B2 * | 1/2020 | Chen | H10D 30/6219 |
| 10,804,401 | B2 * | 10/2020 | Chen | H10D 30/60 |
| 10,957,578 | B2 * | 3/2021 | Hong | H10D 30/795 |
| 10,978,587 | B2 * | 4/2021 | Ryu | H10D 62/116 |
| 11,004,739 | B2 | 5/2021 | Pethe et al. | |
| 11,031,484 | B2 * | 6/2021 | Mulfinger | H10D 86/201 |
| 11,031,487 | B2 * | 6/2021 | Yeoh | H10D 64/017 |
| 11,527,651 | B2 * | 12/2022 | Chen | H01L 21/76843 |
| 11,798,948 | B2 * | 10/2023 | Shanbhag | H10D 86/01 |
| 12,020,937 | B2 * | 6/2024 | Peng | H10D 64/62 |
| 2004/0206983 | A1 * | 10/2004 | Yi | H10D 64/519 |
| | | | | 257/E29.12 |
| 2007/0158762 | A1 * | 7/2007 | Anderson | H10D 30/62 |
| | | | | 257/E21.624 |
| 2008/0179635 | A1 * | 7/2008 | Gossner | H10D 30/6219 |
| | | | | 257/241 |
| 2011/0221009 | A1 * | 9/2011 | Chuang | H10D 64/691 |
| | | | | 257/E27.06 |
| 2014/0027862 | A1 | 1/2014 | Herberholz | |
| 2015/0294984 | A1 * | 10/2015 | Cheng | H01L 21/76283 |
| | | | | 438/151 |
| 2016/0079354 | A1 * | 3/2016 | Park | H10D 30/6217 |
| | | | | 257/386 |
| 2016/0093638 | A1 * | 3/2016 | Cheng | H01L 21/26513 |
| | | | | 438/151 |
| 2016/0372562 | A1 * | 12/2016 | Petitprez | H10D 64/259 |
| 2017/0170291 | A1 * | 6/2017 | Mulfinger | H10D 62/151 |
| 2019/0371933 | A1 * | 12/2019 | Chen | H01L 23/485 |
| 2020/0043918 | A1 * | 2/2020 | Liaw | H10D 30/6219 |
| 2020/0144365 | A1 * | 5/2020 | Mulfinger | H10D 84/85 |
| 2020/0152782 | A1 * | 5/2020 | Chen | H10D 64/01 |
| 2020/0411666 | A1 * | 12/2020 | Mulfinger | H10D 30/60 |
| 2021/0043764 | A1 * | 2/2021 | Chen | H10D 84/853 |
| 2021/0091200 | A1 * | 3/2021 | Liu | H10D 30/0212 |
| 2023/0112377 | A1 * | 4/2023 | Shanbhag | H01L 21/7624 |
| | | | | 257/66 |
| 2023/0115015 | A1 * | 4/2023 | Chen | H01L 23/5226 |
| | | | | 257/401 |
| 2023/0146952 | A1 * | 5/2023 | Mulfinger | H10D 30/0212 |
| | | | | 257/288 |
| 2023/0307238 | A1 * | 9/2023 | Peng | H10D 86/201 |
| 2024/0234425 | A1 * | 7/2024 | Ethirajan | H10D 86/201 |
| 2024/0339527 | A1 * | 10/2024 | Holt | H10D 10/821 |
| 2025/0089317 | A1 * | 3/2025 | Yu | H10D 62/151 |

FOREIGN PATENT DOCUMENTS

| | | | | | |
|---|---|---|---|---|---|
| CN | 110556374 | B | * | 8/2023 | H10D 30/797 |
| CN | 118335738 | A | * | 7/2024 | H10D 62/115 |
| DE | 102018115909 | A1 | * | 12/2019 | H01L 21/76895 |
| DE | 102018115909 | B4 | * | 4/2021 | H10D 30/797 |
| EP | 4401123 | A1 | * | 7/2024 | H10D 62/115 |
| KR | 20190136883 | A | * | 12/2019 | H01L 23/485 |
| KR | 20240112195 | A | * | 7/2024 | H10D 62/115 |
| KR | 102863229 | B1 | * | 9/2025 | H10D 86/01 |
| TW | 202240839 | A | | 10/2022 | |
| TW | 202245255 | | | 11/2022 | |
| TW | 202245255 | A | | 11/2022 | |
| TW | 202249123 | | | 12/2022 | |
| TW | 202249123 | A | | 12/2022 | |

OTHER PUBLICATIONS

Foreign Office Action dated Dec. 25, 2024 in TW Application No. 112148153, 12 pages.
Extended European Search Report and Opinion dated May 14, 2024 in EP Application No. 23211353.0-1211, 12 pages.
Josef Watts et al., "RF-pFET in Fully Depleted SOI demonstrates 420 Ghz FtT", IEEE Radio Frequency Integrated Circuits Symposium, 2017, 4 pages.
Zhixing Zhao et al., "22FDSOI device towards RF and mmWave applications", 2021 IEEE BiCMOS and Compound Semiconductor Integrated Circuits and Technology Symposium (BCICTS), 2021, doi: 10.1109BCICTS50416.2021.9682480, 6 pages.
L. Grenouillet et al., "UTBB FDSOI transistors with dual STI for a multi-Vt strategy at 20nm node and below," 2012 International Electron Devices Meeting, 2012, doi: 10.1109/IEDM.2012. 6478974, 4 pages.
L. Grenouillet et al., "UTBB FDSOI scaling enablers for the 10nm node," 2013 IEEE SOI-3D-Subthreshold Microelectronics Technology Unified Conference (S3S), 2013, doi: 10.1109/S3S.2013. 6716546, 2 pages.
Notice of Preliminary Rejection dated Dec. 17, 2024 in KR Application No. 10-2023-0179309, 20 pages.
Foreign Office Action dated Dec. 17, 2024 in KR Application No. 10-2023-0179309, 20 pages.
Watts et al., "RF-pFET in Fully Depleted SOI demonstrates 420 Ghz FT", RMO1B-3 https://ieeexplore.ieee.org/document/ 7969023, Jul. 7, 2017, 4 Pages.
Foreign Office Action dated Sep. 18, 2025 in TW Application No. 112148153, 24 pages.

* cited by examiner

12c

12

12b 14                                    12a 16                              16

16c

16b

12c

12

12b 14                16a

12a

DEVICE WITH ISOLATION STRUCTURES IN ACTIVE REGIONS

BACKGROUND

The present disclosure relates to semiconductor structures and, more particularly, to devices with isolation structures in active regions and methods of manufacture.

Contact Over Active Gate (COAG) is an enhanced semiconductor process flow technique that removes the need for the gate contact to land at the end-to-end spacing region between the nMOS and pMOS devices. COAG is used to enable aggressive scaling of the standard cell height by moving the gate contact over the active gate region, thereby reducing the space region between the end of the nMOS and the end of the pMOS devices.

However, there are limitations posed by the COAG. These limitations are posed by a minimum channel length that can be supported for reliable contact. For example, with minimum channel length, the contact to the active gate and the contact to the source/drain region may contact resulting in a shorting of the device. To address this issue, channel length may be widened. This presents additional issues with respect to Fmax and FT. For example, there is a known inverse relationship between the Fmax and FT such that widening the active regions may improve Fmax, but will also negatively affect FT.

SUMMARY

In an aspect of the disclosure, a structure comprises: an active region; a plurality of isolation structures within the active region; a plurality of gate structures overlapping the plurality of isolation structures within the active region; and diffusion regions on sides of the plurality of gate structures and the plurality of isolation structures.

In an aspect of the disclosure, a structure comprises: at least one active region; a plurality of isolation structures within the at least one active region; a plurality of gate structures overlapping the plurality of isolation structures within the at least one active region; raised source/drain regions on sides of the plurality of gate structures and the plurality of isolation structures; a first set of contacts to the raised source/drain regions; and a second set of contacts to the plurality of gate structures.

In an aspect of the disclosure, a method comprises: forming a plurality of isolation structures within an active region; forming a plurality of gate structures overlapping the plurality of isolation structures within the active region; forming diffusion regions on sides of the plurality of gate structures and the plurality of isolation structures; and forming contacts to the diffusion regions and the plurality of gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to devices with isolation structures in active regions and methods of manufacture. More specifically, the present disclosure relates to a high performance radio frequency (RF) device with embedded shallow trench isolation structures in an active region. For example, in embodiments, the shallow trench isolation structures (e.g., islands) may be embedded within an active region (RX) under an active gate structure and with a contact landing on the gate structure over the shallow trench isolation structures. The shallow trench isolation structures may be enclosed on all sides by the active region.

Advantageously, the present disclosure provides a large width very short channel high performance RF device (high FT/Fmax), with a compact design (e.g., with a same footprint as a conventional Contact over Active Gate Process (COAG) RF multi-finger design). For example, the present disclosure maintains and/or improves FT of a wide device while improving Fmax. Moreover, advantageously, the device does not exhibit shorting between a raised source/drain (S/D) and the active gate structure. In addition, the processes for fabricating the devices are easily integrated with existing process flows with no additional masking steps.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
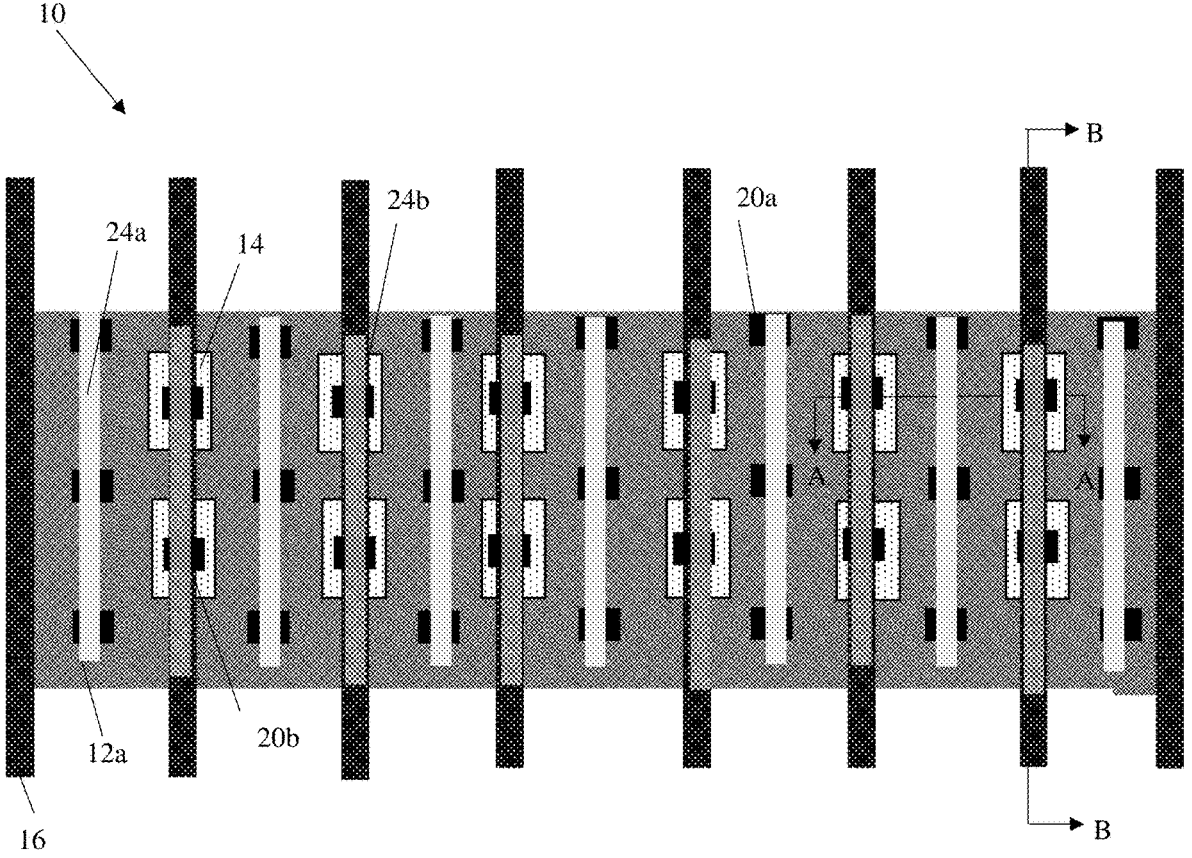
FIG. 1A shows a top view of a device and respective fabrication processes in accordance with aspects of the present disclosure.
Figure 1B:
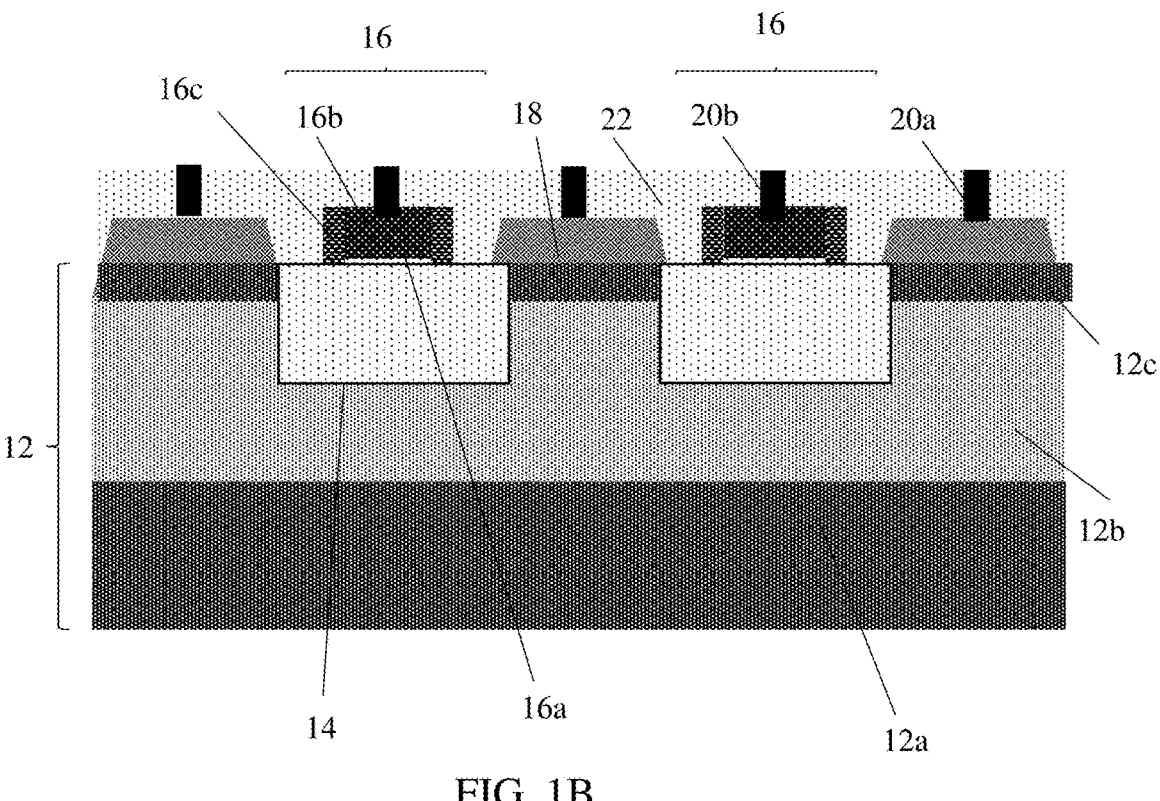
FIG. 1B shows a cross-sectional view of the device of FIG. 1 along A-A.
Figure 1C:
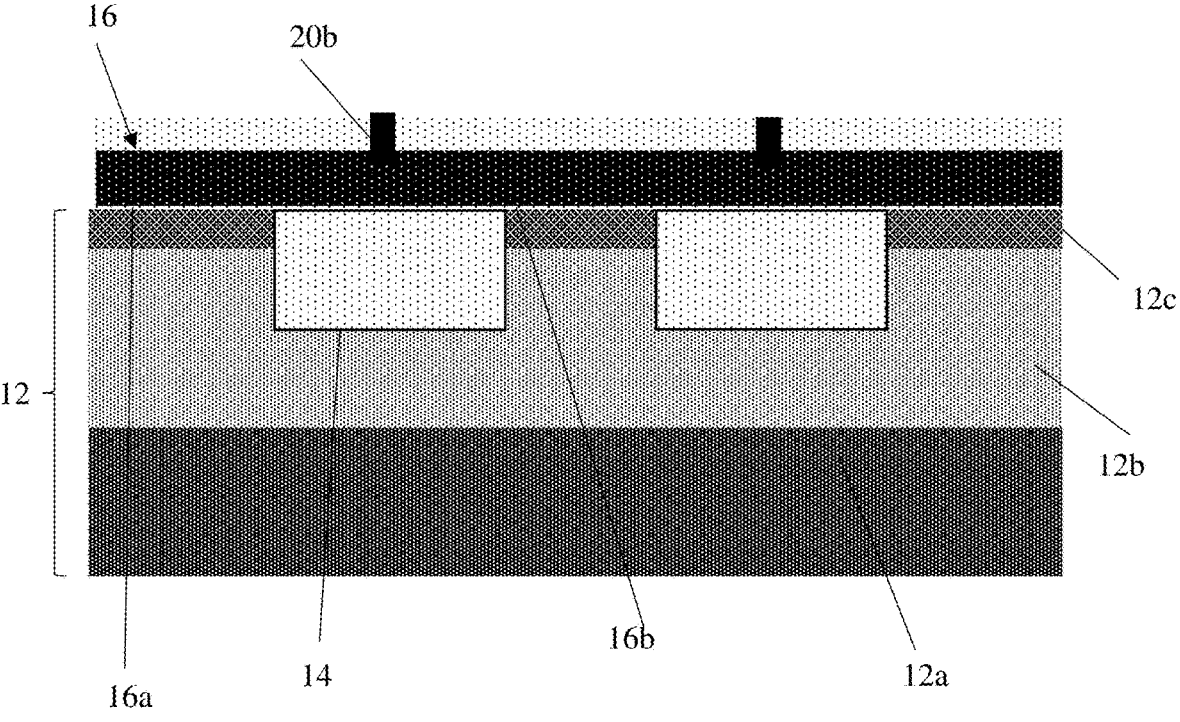
FIG. 1C shows a cross-sectional view of the device of FIG. 1 along B-B.

FIG. 1A shows a top view of a device in accordance with aspects of the present disclosure. FIG. 1B shows a cross-sectional view of the device of FIG. 1 along line A-A; whereas FIG. 1C shows a cross-sectional view of the device of FIG. 1 along line B-B. In embodiments, the device 10 shown in FIGS. 1A-1C may be a multi-finger fully depleted semiconductor on insulator (FDSOI) MOSFET on a single diffusion region.

Referring to FIGS. 1A-1C, the device 10 includes a semiconductor substrate 12. The semiconductor substrate 12 includes a handle substrate 12a, a buried insulator layer 12b on the handle substrate 12a and a top layer of semiconductor material 12c. The handle substrate 12a provides mechanical support to the buried insulator layer 12b and the top semiconductor layer 12c.

In embodiments, the handle substrate 12a and top semiconductor material 12c may be composed of any suitable material including, but not limited to, Si, SiGe, SiGeC, SiC, alloys, GaAs, InAs, InP, and other III/V or II/VI compound semiconductors. In further embodiments, the handle substrate 12a and the top semiconductor layer 12c comprise a single crystalline semiconductor material, such as, for example, single crystalline silicon. The handle substrate 12a and the top semiconductor layer 12c may also comprise any suitable crystallographic orientation (e.g., a (100), (110), (111), or (001) crystallographic orientation). The buried insulator layer 12b comprises any suitable material, including silicon oxide, sapphire, other suitable insulating materials, and/or combinations thereof. An exemplary insulator layer 12b may be a buried oxide layer (BOX).

Shallow trench isolation structures 14 may be formed in the semiconductor substrate 12, e.g., extending to the buried insulator layer 12b. In embodiments, the shallow trench isolation structures 14 may be separate islands embedded within the active region, e.g., top semiconductor layer 12c. In embodiments, the shallow trench isolation structures 14 can also be deep trench isolation structures. As further described herein, the shallow trench isolation structures 14 (e.g., islands of the shallow trench isolation structures 14) are under gate structures 16 and are enclosed on all sides with the active region, e.g., top semiconductor material 12c. As in each of the embodiments, the shallow trench isolation structures 14 may provide a stress enhancement on the channel of the gate structures 16.

Still referring to FIGS. 1A-1C, the gate structures 16 may be formed over the shallow trench isolation structures 14 and the active regions, e.g., top semiconductor layer 12c. In embodiments, the gate structures 16 may overlap and be centered over the shallow trench isolation structures 14. The gate structures 16 can be implemented in a minimum gate length according to design rules. In embodiments, the shallow trench isolation structures 14 will prevent shorting between raised diffusion regions (e.g., source and drain regions) 18 and the gate structures 16, e.g., contacts 20b of the gate structures 16 and contacts 20a of raised source and drain regions 18. Also, by having the gate structures 16 over the shallow trench isolation structures 14 and the active regions, e.g., top semiconductor layer 12c, device electrical characteristics show high FT/high Fmax at a wide active region.

The gate structures 16 include a gate dielectric material 16a, a gate electrode 16b, and sidewall spacers 16c. In embodiments, the gate dielectric material 16a may be a high-k dielectric material or a low-k dielectric material. For example, the high-k dielectric material may be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate electrode 16b may be a polysilicon material or a replacement metal gate material as is known in the art, e.g., Ti, TiAlC, Al, TiAl, TaN, TiN, TiC, Co, etc. The sidewall spacers 16c may comprise nitride and/or oxide.

Although not critical to the understanding of the present disclosure, the gate structures 16 can be fabricated using conventional CMOS processes. For example, the gate structures 16 can be fabricated using standard CMOS or replacement gate processes. In the standard CMOS processing, as further described herein, a gate dielectric and polysilicon are formed, e.g., deposited, on the top semiconductor layer 12c, followed a patterning process. An insulator material such as nitride or oxide can be deposited on the patterned materials, followed by an anisotropic etching process to form the sidewall spacers 16c.

FIGS. 1A-1C further show source/drain regions 18 formed on the top semiconductor layer 12c between the gate structures 16. The source/drain regions 18 may be raised epitaxy regions formed by selectively growing a semiconductor material on the top semiconductor layer 12c.

Contacts 20a, 20b may be formed on the gate electrode 16b and the source/drain regions 18. Wiring structures 24a, 24b may be formed in contact with the respective contacts 20a, 20b. The wiring structures 24b may be aligned with the gate structures 16 (e.g., parallel with the gate structures 16); whereas the wiring structures 24a may be aligned with the contacts 20a over the source/drain regions 18. Accordingly, in embodiments, the contacts 20a may be formed to the source/drain regions 18 and the contacts 20b may be formed to the gate electrode 16b, landing over the shallow trench isolation structures 14.

The contacts 20a, 20b and wiring structures 24a, 24b may be formed by conventional lithography, etching and deposition processes, by forming a trench in an interlevel dielectric material 22 to expose the underlying gate electrode 16b and the source/drain regions 18, followed by a deposition process of a conductive material. In embodiments, for example, the conducive material may be Al or Tungsten, as examples. As further shown in FIG. 1A, for example, the contacts 20b formed on the gate electrode 16b and the contacts 20a formed on the source/drain regions 18 may be staggered, e.g., not aligned with one another. In addition, the contacts 20b on the gate electrodes 16b are aligned over the shallow trench isolation structures 16.

As should be understood by those of skill in the art, prior to the deposition process, a silicide process may be performed on the exposed gate electrode 16b and the source/drain regions 18. The silicide process begins with deposition of a thin transition metal layer, e.g., nickel, cobalt or titanium, over fully formed raised source/drain regions 18 and gate electrode 16b. After deposition of the material, the structure is heated allowing the transition metal to react with exposed silicon (or other semiconductor material as described herein) in the active regions of the semiconductor device (e.g., raised source/drain regions 18 and gate electrode 16b) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Figure 2:
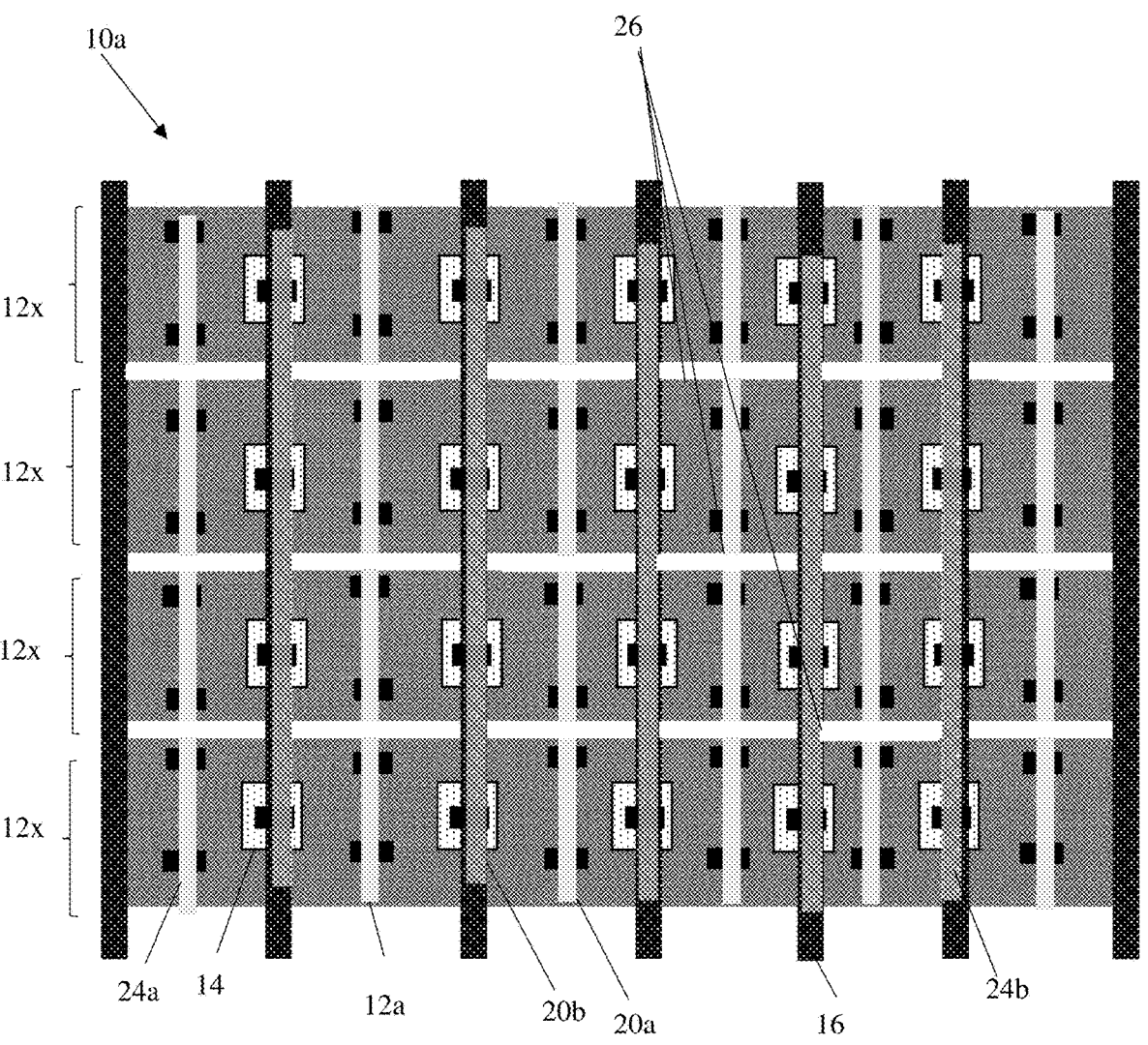
FIG. 2 shows a top view of a device in accordance with additional aspects of the present disclosure.

FIG. 2 shows a top view of a device in accordance with additional aspects of the present disclosure. In the device 10a of FIG. 2, multiple active regions 12x are shown, each separated by a respective isolation structure 26. The isolation structure 26 may be a shallow trench isolation structure or a deep trench isolation structure. The multiple active regions 12x may be separated by a minimum distance allowed by design rules. The gate structures 16 extend over the multiple active regions 12x, and each of the active regions 12x include the shallow trench isolation structures 14 embedded within the active region 12x and aligned with (overlapping) the gate structures 16. The remaining features of the device 10a of FIG. 2 are similar to the device 10 described with respect to FIGS. 1A-1C.

Figure 3:
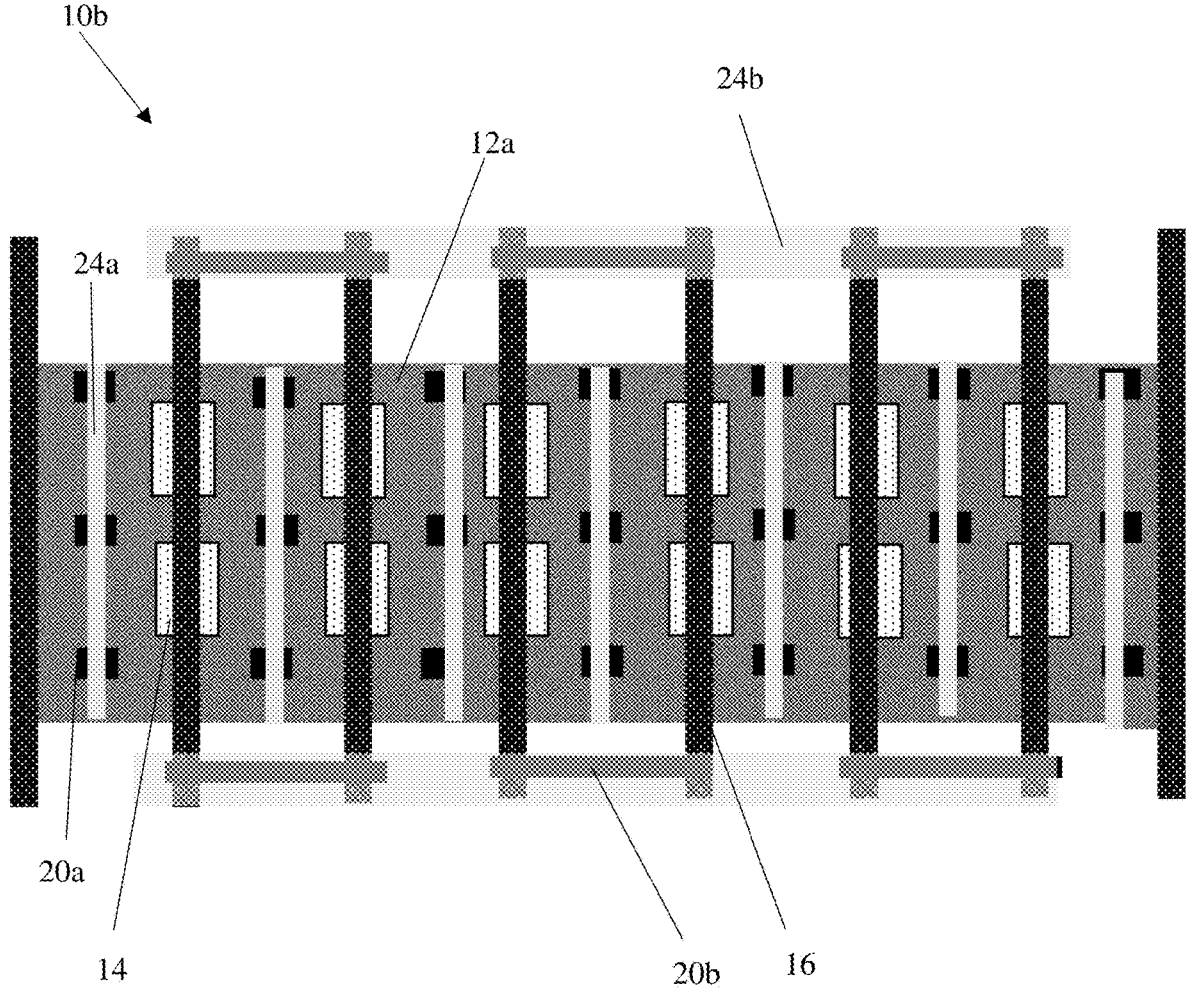
FIG. 3 shows a top view of a device in accordance with further aspects of the present disclosure.

FIG. 3 shows a top view of a device in accordance with further aspects of the present disclosure. In the device 10b of FIG. 3, the contacts 24b for the gate structures 16 are provided above and below the active region 12a. That is, the contacts 24b may be placed beyond the active region 12a on opposite edges of gate structures 16 before termination of the gate structures 16. In this way, the contacts 24b for the gate structures 16 are perpendicular to the gate structures 16 and are not provided on or aligned with the shallow trench isolation structures 14. In embodiments, the wiring structures 24b extend over the multiple contacts 24b for the gate structures 16, e.g., parallel and aligned with the contacts 24b for the gate structures 16. In alternative embodiments, the shallow trench isolation structures 14 may be deep trench isolation structures extending through the buried insulator layer 12b. The remaining features of the device 10b of FIG. 3 are similar to the device 10 described with respect to FIGS. 1A-1C.

Figure 4:
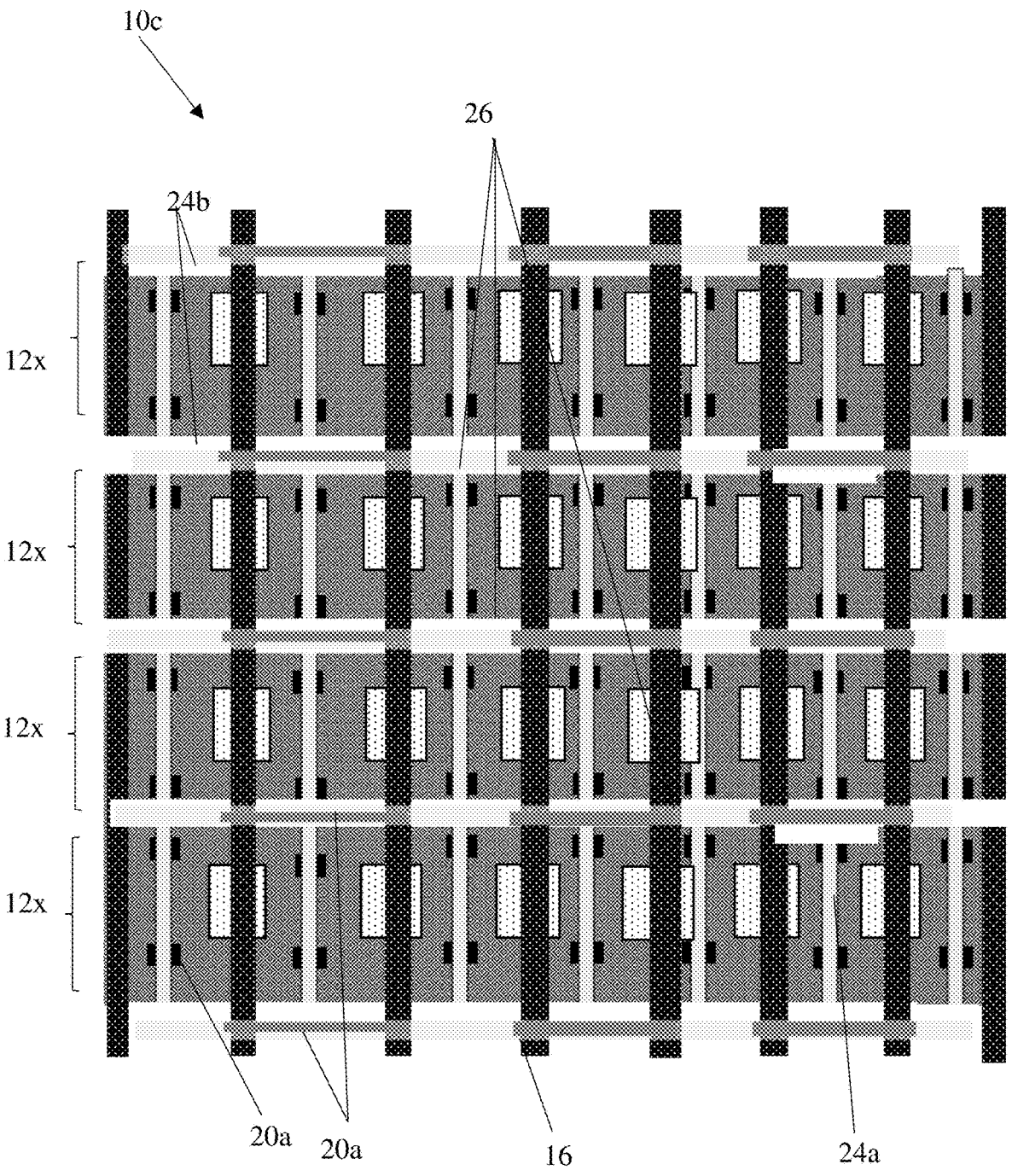
FIG. 4 shows a top view of a device in accordance with additional aspects of the present disclosure.

FIG. 4 shows a top view of a device in accordance with additional aspects of the present disclosure. In the device 10c of FIG. 4, multiple active regions 12x are shown, each separated by the isolation structure 26. The multiple active regions 12x may be separated by a minimum distance allowed by design rules as already described herein. The gate structures 16 extend over the multiple active regions 12x, and each of the active regions 12x includes the shallow trench isolation structures 14 embedded within the active region 12x and aligned with the gate structures 16. The contacts 24b for the gate structures 16 are provided above and below each of the active regions 12x. That is, similar to that shown in FIG. 3, the contacts 24b may be placed beyond the active regions 12x. In this way, the contacts 24b for the gate structures 16 are perpendicular to the gate structures 16 and are not provided on or aligned with the shallow trench isolation structures 14. In embodiments, the wiring structures 24b extend over the multiple contacts 24b for the gate structures 16, e.g., parallel and aligned with the contacts 24b for the gate structures 16. The remaining features of the device 10c of FIG. 4 are similar to the device 10b described with respect to FIG. 3.

Figures 5A, 5B:
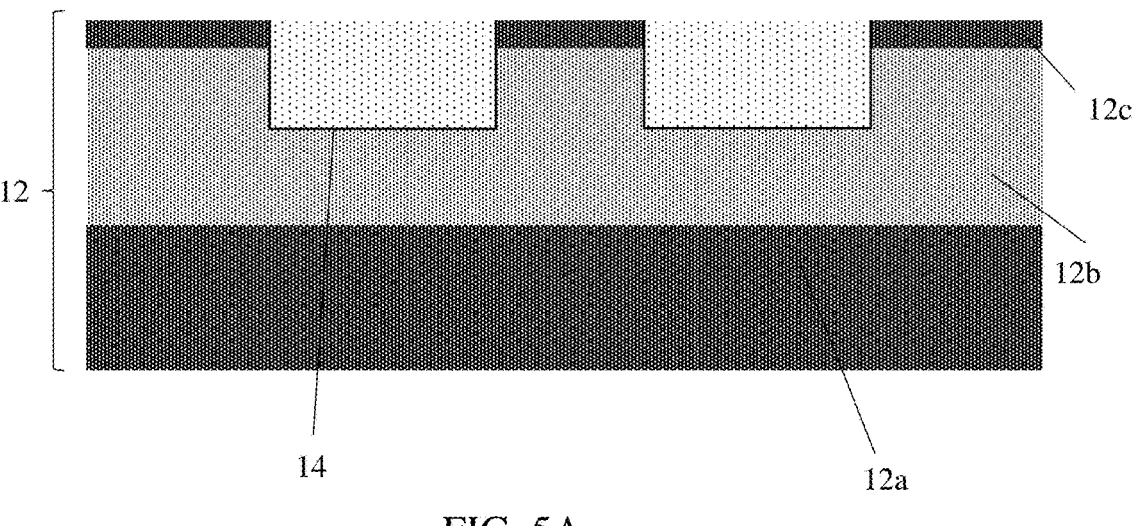
FIGS. 5A-5C show fabrication processes of manufacturing the device of FIGS. 1A-1C.
Figure 5C:
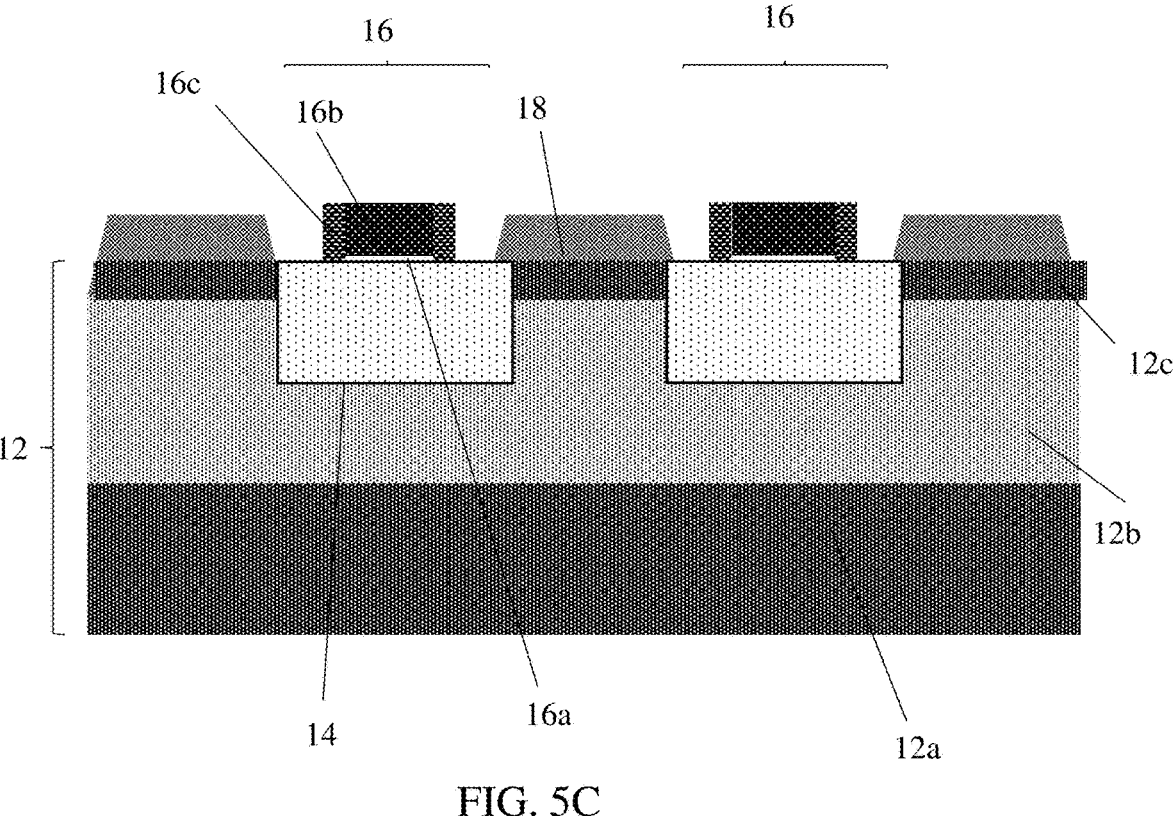

FIGS. 5A-5C show fabrication processes of manufacturing the device 10 of FIGS. 1A-1C. In FIG. 5A, shallow trench isolation structures 14 are formed in the substrate 12. The shallow trench isolation structures 14 can be formed by conventional lithography, etching and deposition methods known to those of skill in the art. For example, a resist formed over the top semiconductor layer 12c is exposed to energy (light) and developed utilizing a conventional resist developer to form a pattern (opening). An etching process with a selective chemistry, e.g., reactive ion etching (RIE), will be used to transfer the pattern from the photoresist layer to the top semiconductor layer 12c to form one or more trenches in the top semiconductor layer 12c and extending into the buried insulator layer 12b through the openings of the resist. Following the resist removal by a conventional oxygen ashing process or other known stripants, the insulator material (e.g., $SiO_2$) can be deposited by any conventional deposition processes, e.g., chemical vapor deposition (CVD) processes. Any residual material on the surface of the top semiconductor layer 12c can be removed by conventional chemical mechanical polishing (CMP) processes. This process can also be used to form deep trench isolation structures.

In FIG. 5B, the gate structures 16 are formed over the shallow trench isolation structures 14. In embodiments, the gate structures 16 can be formed by depositing the gate dielectric material 16a over the shallow trench isolation structures 16 and the active regions, e.g., top semiconductor layer 12c. The gate dielectric material 16a may be blanket deposited using CVD, Plasma Enhanced CVD (PECVD) or atomic layer deposition (ALD), as examples. The gate electrode 16b, e.g., polysilicon, may be blanket deposited over the gate dielectric material 16a using a conventional CVD process. The gate dielectric material 16a and the gate electrode 16b may be patterned using conventional lithography and etching processes as described herein. The sidewall spacers 16c may be formed by a deposition (e.g., CVD) of nitride and/or oxide, followed by an anisotropic etching process.

In FIG. 5C, the source/drain regions 18 may be formed on the active regions, e.g., top semiconductor layer 12c. In accordance with exemplary embodiments, the source/drain regions 18 may be raised epitaxy regions comprising SiGe or Si as examples. In accordance with alternative embodiments of the present disclosure, the epitaxy regions may be formed of a III-V compound semiconductor such as GaAs, InP, GaN, InGaAs, InAlAs, GaSb, AlSb, AlAs, AlP, GaP, combinations thereof, or multi-layers thereof. Depending on whether the resulting device is a p-type FET or an n-type FET, a p-type or an n-type impurity may be in-situ doped. For example, when the resulting FET is a p-type FET, silicon germanium boron (SiGeB) may be grown. Conversely, when the resulting FET is an n-type FET, silicon phosphorous (SiP) or silicon carbon phosphorous (SiCP) may be grown.

FIGS. 1A-1C show the fabrication of the contacts 20a, 20b and wiring structures 24a, 24b, as already described herein.

The devices can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

an active region;

a plurality of isolation structures within the active region;

a plurality of gate structures overlapping the plurality of isolation structures within the active region;

raised source/drain regions on sides of the plurality of gate structures and the plurality of isolation structures; and diffusion regions on sides of the plurality of gate structures and the plurality of isolation structures, wherein the isolation structures have a top surface which is co-planar with a top surface of a substrate, and the gate structures comprise a gate dielectric material which has a bottom surface which is co-planar with the top surface of the substrate and is directly in contact with the top surface of the isolation structures.

2. The structure of claim 1, wherein the plurality of isolation structures comprise shallow trench isolation structures embedded within the active region, and the gate structures further comprise a gate electrode which has a bottom surface which is directly in contact with a top surface of the gate dielectric material.

3. The structure of claim 2, wherein the plurality of isolation structures are surrounded by a top semiconductor layer comprising the active region, and a plurality of sidewall spacers directly contact sidewalls of the gate dielectric material and the gate electrode.

4. The structure of claim 1, wherein the plurality of isolation structures are deep trench isolation structures.

5. The structure of claim 1, wherein the plurality of gate structures comprises polysilicon gate structures which overlap with the plurality of isolation structures and the active region.

6. The structure of claim 1, further comprising contacts to the gate structures and contacts to the diffusion regions over the active region.

7. The structure of claim 6, wherein the contacts to the gate structures are over the plurality of isolation structures.

8. The structure of claim 7, wherein the contacts to the gate structures are offset from the contacts to the diffusion regions.

9. The structure of claim 6, wherein the contacts to the gate structures extend at opposing ends of the gate structures.

10. The structure of claim 6, wherein the active region comprises plural active regions, the gate structures extend over the plural active regions and the contacts to the gate structures are provided between the plural active regions.

11. A structure comprising:

at least one active region;

a plurality of isolation structures within the at least one active region;

a plurality of gate structures overlapping the plurality of isolation structures within the at least one active region;

raised source/drain regions on sides of the plurality of gate structures and the plurality of isolation structures;

a first set of contacts to the raised source/drain regions; and a second set of contacts to the plurality of gate structures, wherein the isolation structures have a top surface which is co-planar with a top surface of a substrate, and the gate structures comprise a gate dielectric material which has a bottom surface which is co-planar with the top surface of the substrate and is directly in contact with the top surface of the isolation structures.

12. The structure of claim 11, wherein the plurality of isolation structures comprise islands embedded within the at least one active region, and the gate structures further comprise a gate electrode which has a bottom surface which is directly in contact with a top surface of the gate dielectric material.

13. The structure of claim 12, wherein the second set of contacts overlap with the plurality of isolation structures, and a plurality of sidewall spacers directly contact sidewalls of the gate dielectric material and the gate electrode.

14. The structure of claim 13, wherein the second set of contacts are offset from the first set of contacts.

15. The structure of claim 12, wherein the second set of contacts are at opposing ends of the plurality of gate structures.

16. The structure of claim 12, wherein the at least one active region comprises a plurality of active regions and the second set of contacts are provided at ends of each of plurality of the active regions.

17. The structure of claim 16, wherein the plurality of gate structures extend between the plurality of active regions and over isolation regions that isolate each of the active regions from one another.

18. The structure of claim 11, further comprising wiring structures contacting the second set of contacts and which are parallel to the plurality of gate structures.

19. The structure of claim 11, further comprising wiring structures contacting the second set of contacts and which are perpendicular to the plurality of gate structures.

20. A method comprising:

forming a plurality of isolation structures within an active region;

forming a plurality of gate structures overlapping the plurality of isolation structures within the active region;

forming diffusion regions on sides of the plurality of gate structures and the plurality of isolation structures;

forming raised source/drain regions on sides of the plurality of gate structures and the plurality of isolation structures; and forming contacts to the diffusion regions and the plurality of gate structures: wherein the isolation structures have a top surface which is co-planar with a top surface of a substrate, and the gate structures comprise a gate dielectric material which has a bottom surface which is co-planar with the top surface of the substrate and is directly in contact with the top surface of the isolation structures.

* * * * *